United States Patent
Twynam (10) Patent No.: US 9,269,801 B2
(45) Date of Patent: Feb. 23, 2016

(54) NORMALLY-OFF-TYPE HETEROJUNCTION FIELD-EFFECT TRANSISTOR

(71) Applicant: SHARP KABUSHIKI KAISHA, Osaka-shi, Osaka (JP)

(72) Inventor: John Kevin Twynam, Osaka (JP)

(73) Assignee: SHARP KABUSHIKI KAISHA, Osaka (JP)

( * ) Notice: Subject to any disclaimer, the term of this patent is extended or adjusted under 35 U.S.C. 154(b) by 0 days.

(21) Appl. No.: 14/369,027

(22) PCT Filed: Dec. 12, 2012

(86) PCT No.: PCT/JP2012/082183
§ 371 (c)(1),
(2) Date: Jun. 26, 2014

(87) PCT Pub. No.: WO2013/099602
PCT Pub. Date: Jul. 4, 2013

(65) Prior Publication Data
US 2014/0367742 A1    Dec. 18, 2014

(30) Foreign Application Priority Data
Dec. 27, 2011    (JP) .................. 2011-285857

(51) Int. Cl.
*H01L 29/778*    (2006.01)
*H01L 29/66*    (2006.01)
*H01L 29/47*    (2006.01)
*H01L 29/20*    (2006.01)

(52) U.S. Cl.
CPC .......... *H01L 29/7783* (2013.01); *H01L 29/475* (2013.01); *H01L 29/66462* (2013.01); *H01L 29/7786* (2013.01); *H01L 29/2003* (2013.01)

(58) Field of Classification Search
CPC ................................................ H01L 29/7783
USPC ................................................ 257/194
See application file for complete search history.

(56) References Cited

U.S. PATENT DOCUMENTS

| | | | |
|---|---|---|---|
| 8,193,562 B2 * | 6/2012 | Suh et al. | 257/194 |
| 2002/0017696 A1 * | 2/2002 | Nakayama et al. | 257/471 |
| 2006/0273347 A1 | 12/2006 | Hikita et al. | |
| 2007/0194354 A1 * | 8/2007 | Wu et al. | 257/288 |
| 2009/0072240 A1 * | 3/2009 | Suh et al. | 257/76 |

FOREIGN PATENT DOCUMENTS

JP    2006-339561 A    12/2006

OTHER PUBLICATIONS

International Search Report, mailed Feb. 19, 2013, issued in PCT/JP2012/082183.

* cited by examiner

*Primary Examiner* — Edward Wojciechowicz
(74) *Attorney, Agent, or Firm* — Birch, Stewart, Kolasch & Birch, LLP (57) ABSTRACT

A normally-off-type HFET includes: an undoped $Al_wGa_{1-w}N$ layer of $t_1$ thickness, an undoped $Al_xGa_{1-x}N$ layer of $t_2$ thickness and an undoped GaN channel layer of $t_{ch}$ thickness that are sequentially stacked; a source electrode and a drain electrode separated from each other and electrically connected to the channel layer; an undoped $Al_yGa_{1-y}N$ layer of $t_3$ thickness formed between the source electrode and the drain electrode on the channel layer; an $Al_zGa_{1-z}N$ layer of $t_4$ thickness formed in a shape of a mesa on a partial area of the $Al_yGa_{1-y}N$ layer between the source electrode and the drain electrode; and a Schottky barrier type gate electrode formed on the $Al_zGa_{1-z}N$ layer, in which conditions of $y>x>w>z$, $t_1>t_4>t_3$ and $2wt_{ch}/(x-w)>t_2>1$ nm are satisfied.

7 Claims, 13 Drawing Sheets

NORMALLY-OFF-TYPE HETEROJUNCTION FIELD-EFFECT TRANSISTOR

TECHNICAL FIELD

The present invention is related to a heterojunction field-effect transistor (HFET) utilizing nitride semiconductors and particularly to improvement of the HFET of a normally-off-type.

BACKGROUND ART

In comparison with Si-based semiconductors, GaAs-based semiconductors and the like, nitride semiconductors such as GaN and AlGaN have advantages of higher breakdown voltage and excellent heat resistance as well as higher saturated drift velocity of electrons, and thus are expected to be able to provide electronic devices that are excellent in high-temperature operation and high-power operation.

In the HFET that is a kind of electronic device formed using such nitride semiconductors, it is well known to generate a two-dimensional electron gas layer resulting from a heterojunction included in a nitride semiconductor stacked-layer structure, and control electric current between source and drain electrodes by a gate electrode having a Schottky barrier junction with the nitride semiconductor layer.

Figure 18:
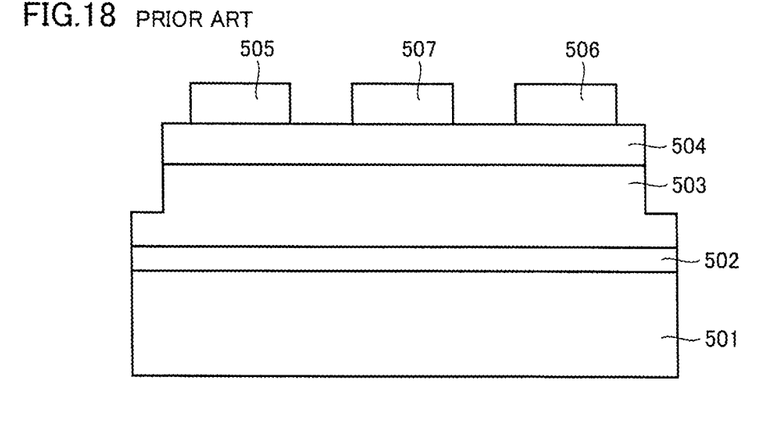
FIG. 18 is a schematic cross-sectional view of an example of a conventional normally-on-type HFET.

FIG. 18 is a schematic cross-sectional view of a typical conventional HFET using an AlGaN/GaN heterojunction. In this HFET, sequentially stacked on a sapphire substrate 501 are a low-temperature GaN buffer layer 502, an undoped GaN layer 503, and an n-type AlGaN layer 504. A source electrode 505 and a drain electrode 506 each including stacked layers of a Ti layer and an Al layer are formed on n-type AlGaN layer 504. A gate electrode 507 including stacked layers of a Ni layer, a Pt layer and an Au layer is formed between source electrode 505 and drain electrode 506. The HFET of FIG. 18 is a normally-on-type in which even when the gate voltage is 0V, a drain current can flow due to high density of two-dimensional electron gas generated in a heterointerface between undoped GaN layer 503 and n-type AlGaN layer 504.

When an HFET is used as a power transistor, there sometimes occur safety flaws, in case of power outage for example, in a circuit including a normally-on-type HFET. Therefore, in order that an HFET is used as a power transistor, it must be a normally-off-type in which a current does not flow when its gate voltage is 0V. To satisfy this requirement, Patent Document 1 of Japanese Patent Laying-Open No. 2006-339561 proposes an HFET utilizing a mesa structure and a p-n junction in its gate.

CITATION LIST

Patent Document

PTD 1. Japanese Patent Laying-Open No. 2006-339561

SUMMARY OF INVENTION

Technical Problem

Figure 19:
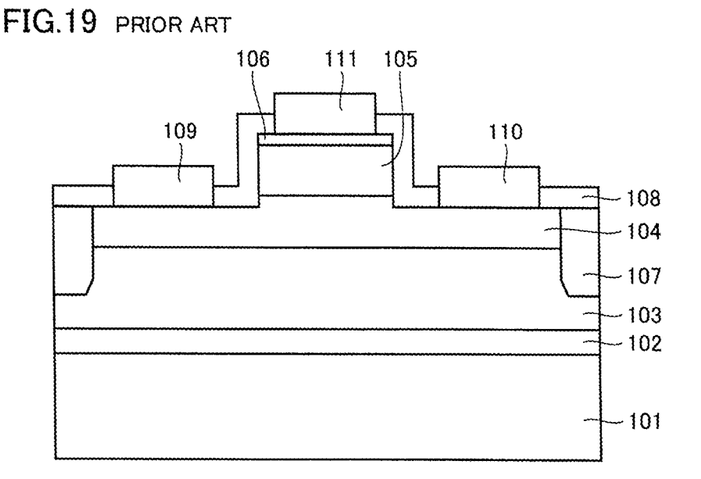
FIG. 19 is a schematic cross-sectional view of a normally-off-type HFET according to patent document 1.

FIG. 19 shows a schematic cross-sectional view of a normally-off-type HFET disclosed in patent document 1. In this HFET, sequentially stacked on a sapphire substrate 101 are a 100 nm thick AlN buffer layer 102, a 2 μm thick undoped GaN layer 103, a 25 nm thick undoped AlGaN layer 104, a 100 nm thick p-type GaN layer 105, and a 5 nm thick heavily-doped p-type GaN layer 106. Undoped AlGaN layer 104 in this HFET is formed with undoped $Al_{0.25}Ga_{0.75}N$, and formed thereon are p-type GaN layer 105 and heavily doped p-type GaN layer 106 that compose a mesa.

Provided on heavily doped p-type GaN layer 106 is a Pd gate electrode 111 in ohmic contact therewith. Further, provided on undoped AlGaN layer 104 are a source electrode 109 and a drain electrode 110 each including a stacked layer of a Ti layer and an Al layer, between which p-type GaN layer 105 is positioned. These electrodes are provided in an area surrounded by a device isolation region 107. Furthermore, the upper surface of the nitride semiconductor stacked-layer structure is protected with an SiN film 108.

The feature of the HFET in FIG. 19 resides in that since gate electrode 111 forms ohmic contact with heavily doped p-type GaN layer 106, a p-n junction is formed in the gate region between p-type GaN layer 105 and a two-dimensional electron gas layer formed in the interface between undoped AlGaN layer 104 and undoped GaN layer 103. Then, since the barrier due to the p-n junction is higher than the barrier due to the Schottky barrier junction, gate current leak hardly occurs even with high gate voltage in this HFET as compared to a conventional HFET including a gate electrode having a Schottky barrier junction.

Further, in the HFET of FIG. 19, since heavily doped p-type GaN layer 106 is provided beneath gate electrode 111, an ohmic contact is readily formed therebetween. In general, since it is difficult to form an ohmic contact with a p-type nitride semiconductor, heavily doped p-type GaN layer 106 is provided.

In the meantime, it is well known that it is not easy to generate p-type carriers at high concentration by activating p-type impurities of high concentration. In general, in order to generate p-type carriers at high concentration by activating p-type impurities of high concentration, electron irradiation or high-temperature annealing is required. Furthermore, a threshold voltage $V_{th}$ is relatively low in the HFET of FIG. 19, which causes a problem that a special driver is required for operation.

Therefore, an object of the present invention is to provide a normally-off-type HFET having a relatively higher threshold voltage and a relatively lower on-resistance with an easier process and at a lower cost.

Solution to Problem

A normally-off-type HFET according to one embodiment of the present invention includes: an undoped $Al_wGa_{1-w}N$ layer of $t_1$ thickness, an undoped $Al_xGa_{1-x}N$ layer of $t_2$ thickness and an undoped GaN channel layer of $t_{ch}$ thickness that are sequentially stacked; a source electrode and a drain electrode separated from each other and electrically connected to the channel layer; an undoped $Al_yGa_{1-y}N$ layer of $t_3$ thickness formed between the source electrode and the drain electrode on the channel layer; an $Al_zGa_{1-z}N$ layer of $t_4$ thickness formed in a shape of a mesa on a partial area of the $Al_xGa_{1-y}N$ layer between the source electrode and the drain electrode; and a Schottky barrier type gate electrode formed on the $Al_zGa_{1-z}N$ layer, in which conditions of $y>x>w>z$, $t_1>t_4>t_3$ and $2wt_{ch}/(x-w)>t_2>1$ nm are satisfied.

Incidentally, it is preferable that a condition of $w-z>0.03$ is satisfied. It is also preferable that a condition of $t_4/t_3>4$ is satisfied. The gate electrode can be formed with an Ni/Au stacked layer, a WN layer, a TiN layer, a W layer, or a Ti layer. It is further desirable that the $Al_wGa_{1-w}N$ layer, the $Al_xGa_{1-x}N$ layer, the GaN channel layer, the $Al_yGa_{1-y}N$ layer, and the $Al_zGa_{1-z}N$ layer each have a Ga polarity in which a Ga atomic plane appears on a (0001) plane of an upper surface side.

A normally-off-type HFET according to another embodiment of the present invention includes: an undoped $Al_wGa_{1-w}N$ layer of $t_1$ thickness and an undoped GaN channel layer of $t_{ch}$ thickness that are sequentially stacked; a source electrode and a drain electrode separated from each other and electrically connected to the channel layer; an undoped $Al_yGa_{1-y}N$ layer of $t_3$ thickness formed between the source electrode and the drain electrode on the channel layer; an $Al_zGa_{1-z}N$ layer of $t_4$ thickness formed in a shape of a mesa on a partial area of the $Al_yGa_{1-y}N$ layer between the source electrode and the drain electrode; and a Schottky barrier type gate electrode formed on the $Al_zGa_{1-z}N$ layer, in which conditions of y>w>z and $t_1>t_4>t_3$ are satisfied.

Advantageous Effect of Invention

According to the present invention as described above, it is possible to provide a normally-off-type HFET having a relatively higher threshold voltage and a relatively lower on-resistance with an easier process and at a lower cost.

DESCRIPTION OF EMBODIMENTS

Reference Embodiment

Figure 1:
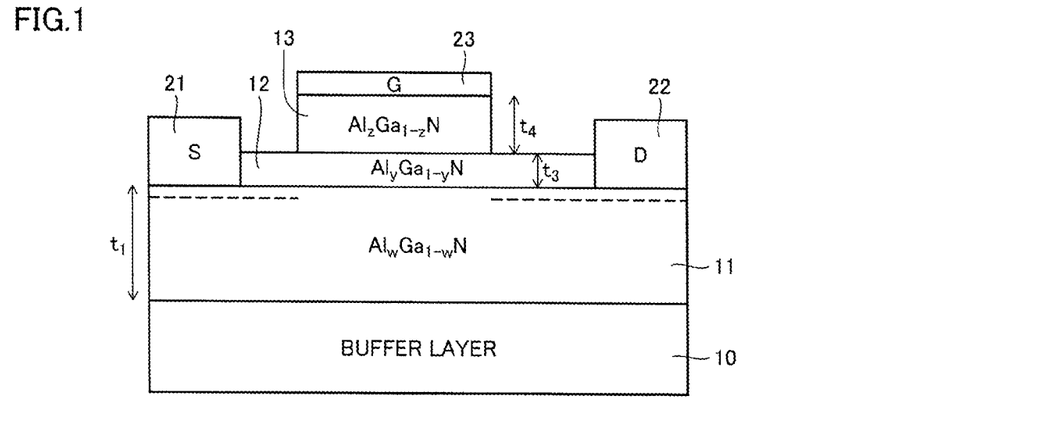
FIG. 1 is a schematic cross-sectional view of an HFET according to a reference embodiment closely related to the present invention.

FIG. 1 is a schematic cross-sectional view of an HFET according to a reference embodiment closely related to the present invention. Incidentally, the thickness, length, width, and the like in the drawings of this application are arbitrarily changed for clarity and simplicity of the drawings and thus do not reflect their actual dimensional relation.

In an HFET of FIG. 1, an undoped $Al_wGa_{1-w}N$ layer 11 of $t_1$ thickness is stacked on a substrate such as of sapphire (not shown) with a buffer layer 10 interposed therebetween. A source electrode 21 and a drain electrode 22 are formed separated from each other so as to be electrically connected to this $Al_wGa_{1-w}N$ layer 11. An undoped $Al_yGa_{1-y}N$ layer 12 of $t_3$ thickness is deposited between source electrode 21 and drain electrode 22 on $Al_wGa_{1-w}N$ layer 11. An undoped $Al_zGa_{1-z}N$ layer 13 of thickness is formed in a shape of a mesa on a partial area of $Al_yGa_{1-y}N$ layer 12 between source electrode 21 and drain electrode 22. A gate electrode 23 of a Schottky barrier type is formed on $Al_zGa_{1-z}N$ layer 13. Incidentally, each of these $Al_wGa_{1-w}N$ layer, $Al_yGa_{1-y}N$ layer and $Al_zGa_{1-z}N$ layer has a Ga polarity in which a Ga atomic plane appears on a (0001) plane of the upper surface side. Furthermore, in FIG. 1, the dashed line shown in $Al_wGa_{1-w}N$ layer 11 represents two-dimensional electron gas.

Figure 2:
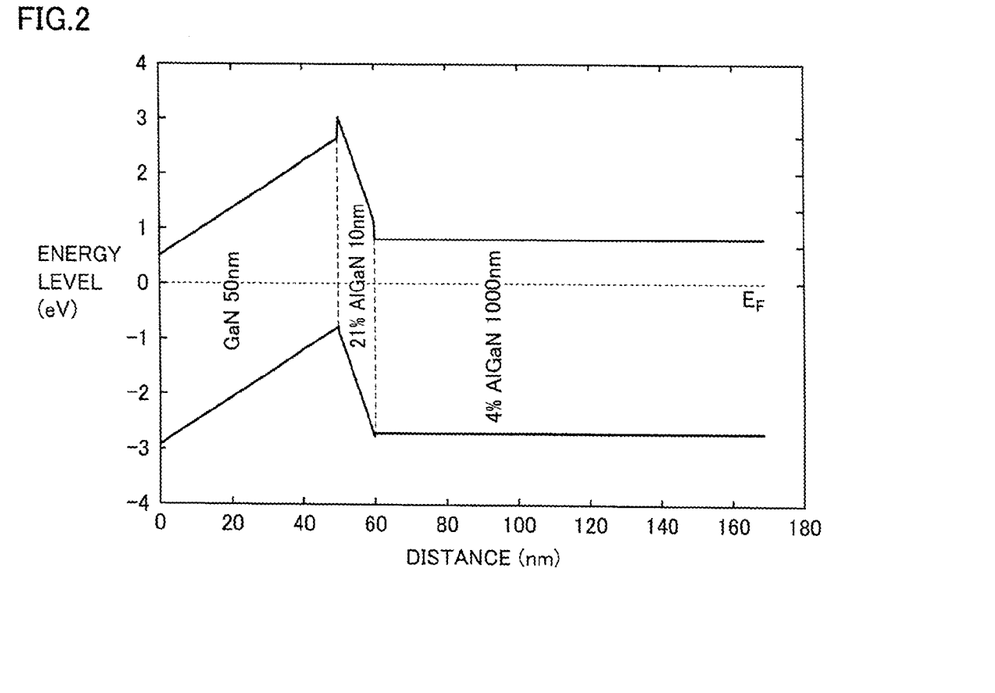
FIG. 2 is a graph schematically showing an example of an energy band structure in the HFET of FIG. 1.

The graph in FIG. 2 schematically shows an example of an energy band structure in the HFET of FIG. 1. Namely, the horizontal axis of this graph represents the distance (nm) in the depth direction from the upper surface of $Al_zGa_{1-z}N$ layer 13, while the vertical axis represents the electron energy level (eV) with the Fermi energy level $E_F$ being a reference level of 0 eV. In the example of FIG. 2, there are set w=0.04, $t_1$=1000 nm, y=0.21, $t_3$=10 nm, z=0, and $t_4$=50 nm.

Figure 3:
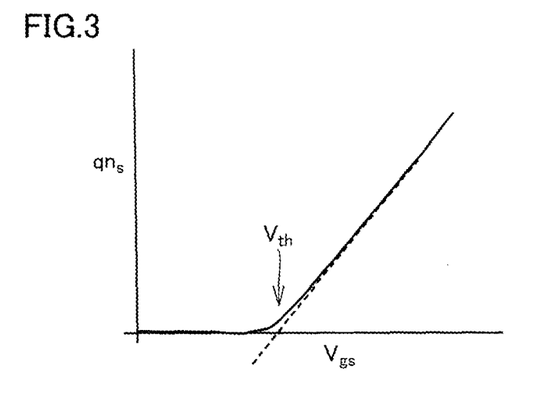
FIG. 3 is a graph showing the relation between a sheet charge density $qn_s$ and a source-gate voltage $V_{gs}$ in the HFET of FIG. 1.

FIG. 3 is a graph schematically showing the relation between a sheet charge density $qn_s$ and a source-gate voltage $V_{gs}$ in the HFET. As shown with a solid curved line in this graph, a threshold voltage $V_{th}$ corresponds to source-gate voltage $V_{gs}$ at the time when sheet charge density $qn_s$ shifts to the positive value side with the increased source-gate voltage $V_{gs}$.

The positive value part of the solid curved line in the graph of FIG. 3 can be approximated with a linear line shown by a broken line, and a sheet charge density $qn_s$ (C/cm²) can be expressed by the following formula (1) proportional to $V_{gs}$. Incidentally, this formula (1) can be derived from a capacitance model.

$$qn_s = \sigma_{31} + \sigma_{43} \cdot t_4 \in_3 /(t_3 \in_4 + t_4 \in_3) + C \cdot (V_{gs} - V_b) \quad (1)$$

Here, q denotes the charge of an electron, n, denotes the sheet electron density (cm⁻²), $\sigma_{31}$ denotes the positive fixed sheet charge density due to the polarization difference between $Al_wGa_{1-w}N$ layer 11 and $Al_yGa_{1-y}N$ layer 12, $\sigma_{43}$ denotes the negative fixed sheet charge density due to the polarization difference between $Al_yGa_{1-y}N$ layer 12 and $Al_zGa_{1-z}N$ layer 13, $t_3$ and $t_4$ respectively denote the thicknesses of $Al_yGa_{1-y}N$ layer 12 and $Al_zGa_{1-z}N$ layer 13, $\in_3$ and $\in_4$ respectively denote the dielectric constants of $Al_y$:$Ga_{1-y}N$ layer 12 and $Al_zGa_{1-z}N$ layer 13, C denotes the capacitance per unit area between the channel layer and the gate electrode (also referred to as a gate capacitance), $V_{gs}$ denotes the gate-source voltage, and $V_b$ denotes (1/q)×(Schottky barrier height of the gate electrode).

Figure 4:
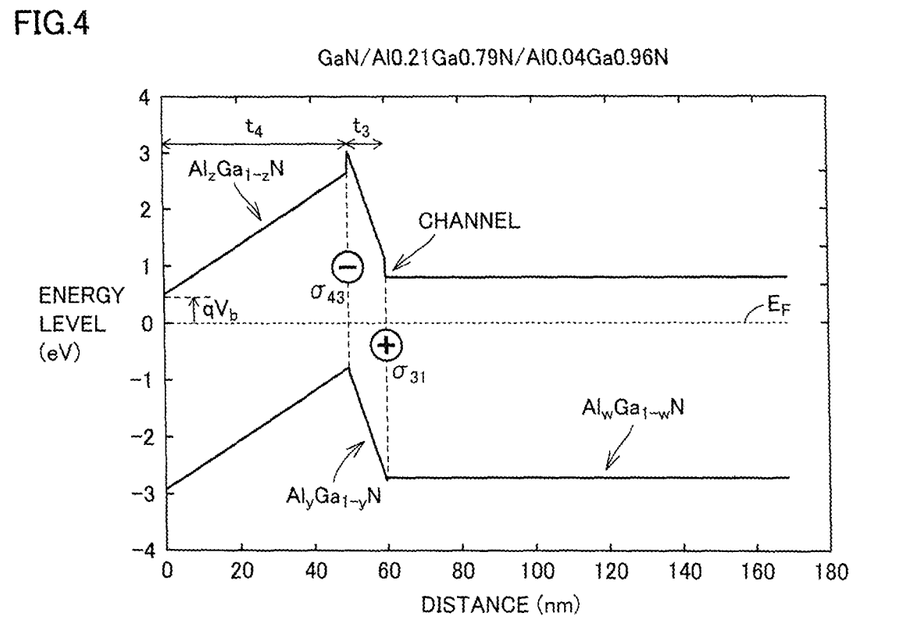
FIG. 4 is a graph schematically showing, in the energy band structure, a fixed sheet charge density σ caused due to the polarity difference between two adjacent layers in a heterojunction interface.

As a reference to formula (1), FIG. 4 schematically shows fixed sheet charge densities $\sigma_{31}$ and $\sigma_4$; in the energy band structure corresponding to FIG. 2.

In the case of the normally-off-type of HFET, since $qn_s$=0/cm² should be established when $V_{gs}$=$V_{th}$ (threshold voltage), formula (2) is derived from formula (1) and can be changed into formula (3).

$$0 = \sigma_{31} + \sigma_{43} \cdot t_4 \in_3 /(t_3 \in_4 + t_4 \in_3) + C \cdot (V_{th} - V_b) \quad (2)$$

$$V_{th} = V_b - (1/c) \cdot \{\sigma_{31} + \sigma_{43} \cdot t_4 \in_3 /(t_3 \in_4 + t_4 \in_3)\} \quad (3)$$

Further, since $1/C = t_3/\in_3 + t_4/\in_4$, formula (3) can be changed into formula (4).

$$V_{th} = V_b - (t_3/\in_3 + t_4/\in_4) \cdot \{\sigma_{31} + \sigma_{43} \cdot t_4 \in_3 /(t_3 \in_4 + t_4 \in_3)\} \quad (4)$$

Here, $\in_3 \approx \in_4$ can be presumed and thus formula (4) can be changed into formula (5).

$$V_{th} \approx V_b - \sigma_{31}(t_3+t_4)/\in_4 - \sigma_{43} t_4/\in_4 \quad (5)$$

Further, $\sigma_{31}$ depends on the Al composition ratios in $Al_wGa_{1-w}N$ layer 11 and $Al_yGa_{1-y}N$ layer 12, and it can be expressed with $\sigma_{31} = a(y-w)$. Similarly, $\sigma_{43}$ depends on the Al composition ratios in $Al_yGa_{1-y}N$ layer 12 and $Al_zGa_{1-z}N$ layer 13, and it can be expressed with $\sigma_{43} = (z-y)$. Here, "a" denotes a proportional constant (C/cm²).

Therefore, formula (5) can be expressed by formula (6) and then changed into formula (7).

$$V_{th} \approx V_b - a(y-w)(t_3+t_4)/\in_4 - a(z-y)t_4/\in_4 \quad (6)$$

$$V_{th} \approx V_b + a(w-z)t_4/\in_4 - a(y-w)t_3/\in_4 \quad (7)$$

Here, the proportional constant "a" can be determined experimentally, and it is possible to adopt a value of a=8.65×10⁻⁶C/cm².

Figure 5:
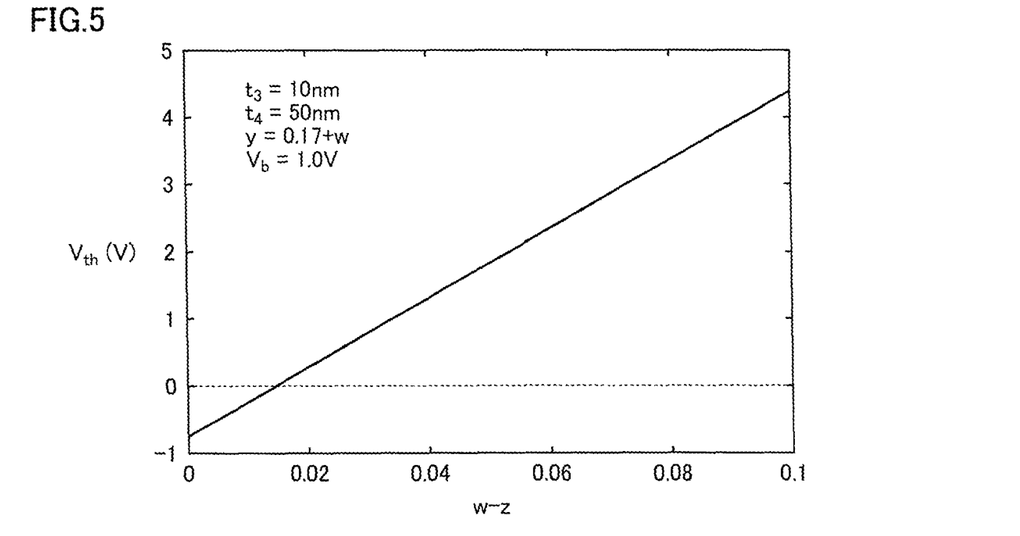
FIG. 5 is a graph showing a result of calculation determining the relation between a threshold voltage $V_{th}$ and the Al composition ratio in a plurality of nitride semiconductor layers included in the HFET of FIG. 1.

The graph of FIG. 5 shows threshold voltage $V_{th}$ obtained depending on (w−z) under the condition that $t_3$=10 nm, $t_4$=50 nm, y−w=0.17, and $V_b$=1.0V are presumed as typical values in formula (7). Namely, the horizontal axis of the graph in FIG. 5 represents (w−z) while the vertical axis thereof represents $V_{th}$(V). As seen in the graph of FIG. 5, it is preferable to satisfy a condition of w−z>0.03 in order to obtain a normally-off-type HFET having a threshold voltage $V_{th}$>1V higher than $V_{th}$=0V. It is also understood that $V_{th}$ can be made higher by increasing the value of "w".

Figure 6:
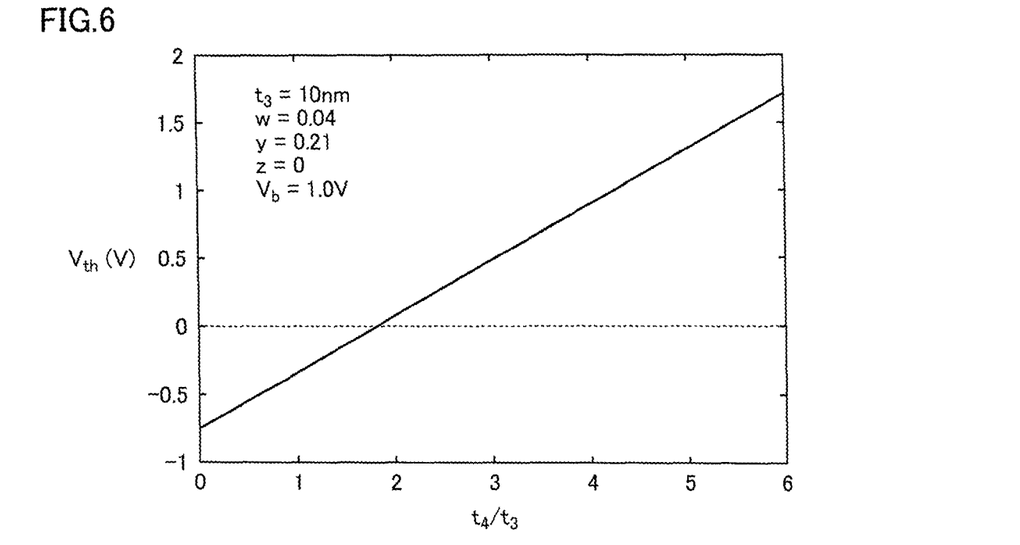
FIG. 6 is a graph showing a result of calculation determining the relation between threshold voltage $V_{th}$ and the thickness ratio in the plurality of nitride semiconductor layers included in the FLEET of FIG. 1.

The graph of FIG. 6 shows threshold voltage $V_{th}$ obtained depending on $t_4/t_3$ under the condition that w=0.04, y=0.21, z=0, $t_3$=10 nm, and $V_b$=1.0V are presumed as typical values in formula (7). Namely, the horizontal axis of the graph in FIG. 6 represents $t_4/t_3$ while the vertical axis thereof represents $V_{th}$(V). As seen in the graph of FIG. 6, it is preferable to satisfy a condition of $t_4/t_3$>4 in order to obtain a normally-off-type HFET having a threshold voltage $V_{th}$>1V higher than $V_{th}$=0V.

Figure 7:
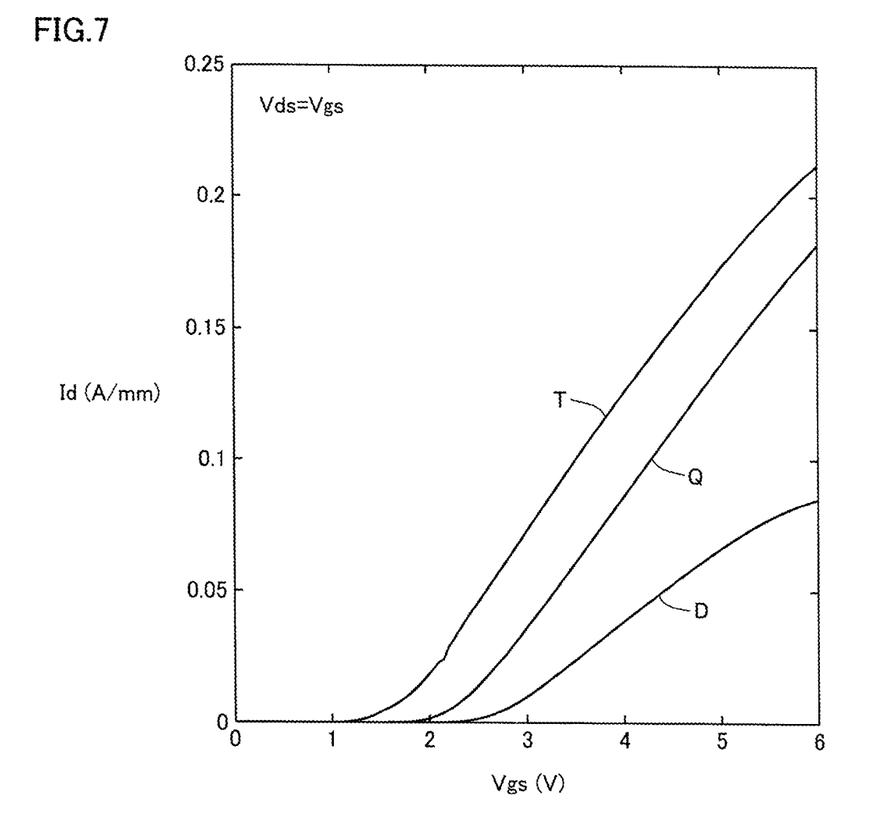
FIG. 7 is a graph showing measured data of the relation between a drain current $I_d$ and a source-gate voltage $V_{gs}$ in the actually manufactured HFET.

A curved line D in the graph of FIG. 7 shows measured voltage-current characteristics in the HFET of FIG. 1 in the case that w=0.05, $t_1$=1000 nm, y=0.25, $t_3$=10 nm, z=0, and $t_4$=60 nm are set, and source electrode 21 and drain electrode 22 are formed with a TiAl layer while the gate electrode is formed with a TiN layer.

The horizontal axis of the graph in FIG. 7 represents source-gate voltage $V_{gs}$(V) while the vertical axis thereof represents drain current $I_d$ (A/mm). Here, it should be noted that source-drain voltage $V_{ds}$ is set to the voltage equal to source-gate voltage $V_{gs}$. In the graph of FIG. 7, it is seen that $I_d$ rises after $V_{gs}$ becomes greater than 2V, and therefore it is understood that the threshold voltage is actually greater than 2V.

Figure 8:
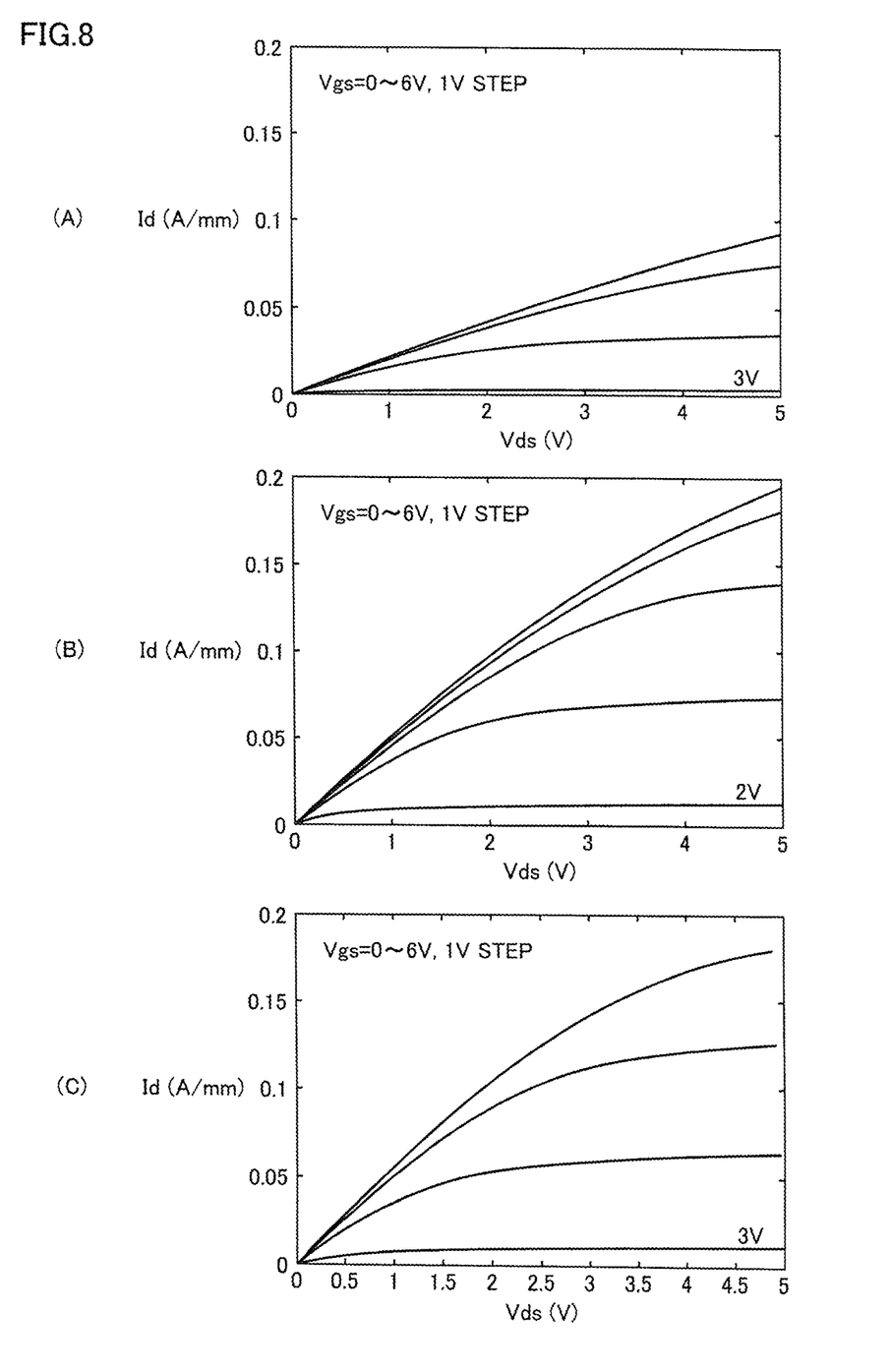
FIG. 8 is a graph showing measured data of the relation between drain current $I_d$ and a source-drain voltage $V_d$, in the actually manufactured HFET.

The graph (A) in FIG. 8 shows a change in drain current $I_d$ caused by the change in source-drain voltage $V_d$, in the HFET having the characteristics of curved line D in FIG. 7. Specifically, the horizontal axis of the graph in FIG. 8 represents source-drain voltage $V_{ds}$(V), while the vertical axis thereof represents drain current L (A/tnin). Here, it should be noted that the curved lines shown in this graph (A) correspond to the condition that source-gate voltage V was sequentially increased from 0V to 6V by a 1V step between a lower line and the next upper line.

In the graph (A), drain current $I_d$ is not observed at source-gate voltage $V_{gs}$ from 0V to 2V, but is observed at source-gate voltage $V_{gs}$ equal to or greater than 3V. This corresponds to the fact that the threshold voltage is greater than 2V in curved line D in FIG. 7. The graph (A), however, shows that the drain current is less increased even when source-gate voltage $V_{gs}$ and source-drain voltage $V_{ds}$ are increased. This means that the on-resistance of the HFET is relatively high.

First Embodiment

Figure 9:
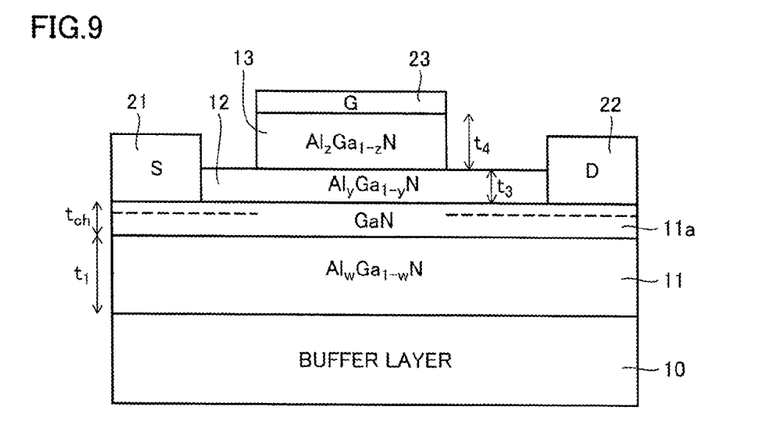
FIG. 9 is a schematic cross-sectional view of an HFET according to one embodiment of the present invention.

FIG. 9 is a schematic cross-sectional view of an HFET according to the first embodiment of the present invention. As compared to FIG. 1, the FIG. 9 HFET is different only in that an undoped GaN channel layer 11a of a $t_{ch}$ thickness in a range from 10 nm or more to less than 50 nm is inserted between $Al_wGa_{1-w}N$ layer 11 and $Al_yGa_{1-y}N$ layer 12. In other words, although the HFET in FIG. 1 includes a double hetero junction, the HFET in FIG. 9 includes a triple heterojunction. The inserted GaN channel layer 11a does not contain Al atoms different from Ga atoms and thus is preferable as a channel layer in view of less electron scattering caused by the different atoms and then higher electron mobility therein.

Figure 10:
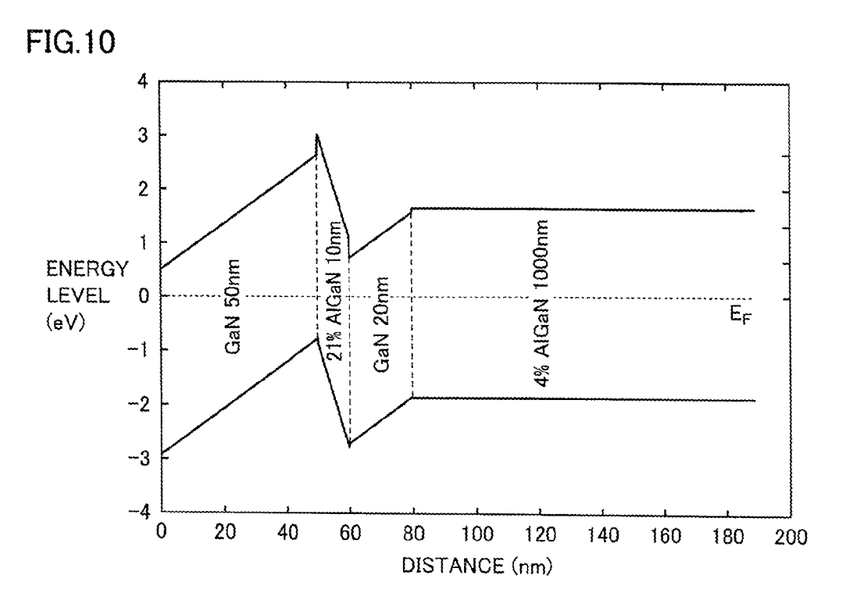
FIG. 10 is a graph schematically showing an example of an energy band structure in the HFET of FIG. 9.

The graph of FIG. 10 similar to FIG. 2 schematically shows an energy band structure in the FIG. 9 HFET including GaN channel layer 11a of 20 nm thickness. Also in the HFET of FIG. 9 including a triple heterojunction in this way, a capacitance model can be applied as in the case of the HFET in FIG. 1 including a double heterojunction. In other words, sheet charge density qn, (C/cm$^2$) in the HFET of FIG. 9 can also be expressed by the following formula (1a) as in the above formula (1).

$$qn_s = (\sigma_{3ch} + \sigma_{ch1}) + \sigma_{43} \cdot t_4 \in_3 / (t_3 \in_4 \in_3) + C \cdot (V_{gs} - V_b) \quad (1a)$$

Here, $\sigma_{ch1}$ denotes a negative fixed sheet charge density due to the polarity difference between $Al_wGa_{1-w}N$ layer 11 and GaN channel layer 11a, and $\sigma_{3ch}$ denotes a positive fixed sheet charge density due to the polarity difference between GaN channel layer 11a and $Al_yGa_{1-y}N$ layer 12.

Figure 11:
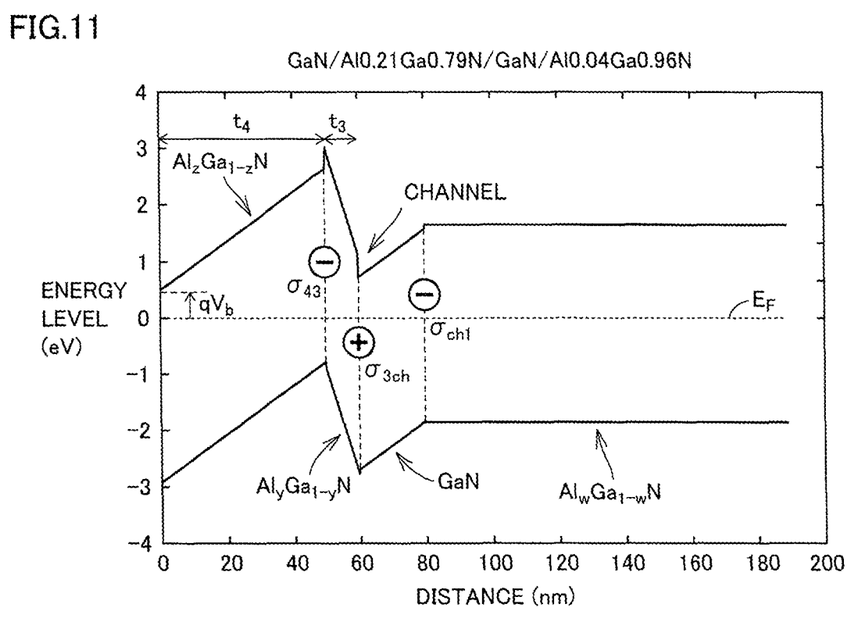
FIG. 11 is a graph schematically showing, in the energy band structure, fixed sheet charge density cs caused due to the polarity difference between two adjacent layers in the heterojunction interface.

As a reference to formula (1a), FIG. 11 schematically shows fixed sheet charge densities $\sigma_{ch1}$, $\sigma_{3ch}$ and $\sigma_{43}$ within the energy band structure corresponding to that in FIG. 10.

When comparing formula (1a) with formula (1), it turns out that these formulas are different only in that $\sigma_{31}$ in formula (1) is replaced with ($\sigma_{3ch} + \sigma_{ch1}$) in formula (1a). Also, formula (1a) can be changed as in the case of formula (1), and the following formula (4a) similar to formula (4) can be obtained.

$$V_{th} = V_b - (t_3 / \in_3 + t_4) \cdot \{(\sigma_{3ch} + \sigma_{ch1}) + \sigma_{43} \cdot t_4 \in_3 / (t_3 \in_4 + t_4 \in_3),\} \quad (4a)$$

A curved line T in the graph of FIG. 7 shows the measured voltage-current characteristics in the HFET of FIG. 9. In this case, the HFET of FIG. 9 having the characteristics of curved line T is different from the HFET of FIG. 1 having the characteristics of curved line D only in that GaN channel layer 11a of a $t_{th}$ thickness=20 nm is inserted between $Al_{0.05}Ga_{0.95}N$ layer 11 and $Al_{0.25}Ga_{0.75}N$ layer 12. As described above, since the GaN layer has electron mobility higher than that of the AlGaN layer, the HFET of FIG. 9 may be expected to have a relatively lower on-resistance.

In fact, as demonstrated in comparison between curved lines D and T in FIG. 7, and in comparison between the graphs (A) and (B) in FIG. 8, it turns out that the HFET in FIG. 9 including GaN channel layer 11a shows drain current $I_d$ higher at the same gate-drain current voltage $V_{gs}$ than that of the HFET in FIG. 1, that is, has a relatively lower on-resistance. However, in comparison between curved lines D and T in FIG. 7, it also turns out that the HFET in FIG. 1 has a threshold voltage higher than 2V, whereas the HFET in FIG. 9 achieves only a relatively lower threshold voltage of about 1V. This means that the HFET of FIG. 9 is preferable for achieving a relatively lower on-resistance, whereas the HFET of FIG. 1 is preferable for achieving a relatively higher threshold voltage.

Based on threshold voltage $V_{th}$ according to formula (4) and formula (4a) that are obtained from the above-mentioned capacitor model, the HFET of FIG. 9 is also expected to achieve threshold voltage $V_{th}$ similar to that in the HFET of FIG. 1. In fact, however, as shown in FIG. 7, the threshold voltage of the HFET in FIG. 9 apparently decreases as compared with the case of the HFET in FIG. 1. The present inventor construed the reason thereof as described below.

When a nitride semiconductor layer is grown by MOCVD (metal-organic chemical vapor-phase deposition), silicon (Si) from silica contained in a reaction container, and carbon (C) from an organometal compound that is a raw material of the nitride semiconductor tend to be contained as impurities in the deposited nitride semiconductor layer. These impurities form a donor-shaped impurity level in the deep position that is far away from a lower limit level Ev of the conduction band. If such a deep impurity level exists near the Fermi level, it is considered that the impurity level acting as a fixed charge exerts an influence upon the Fermi level, thereby adversely affecting the threshold voltage of the HFET.

Figure 12A:
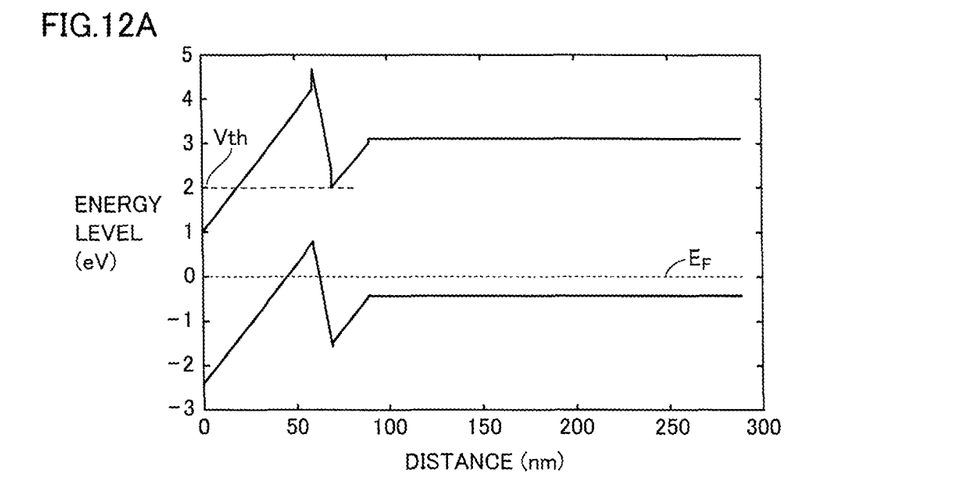
FIG. 12A is a graph schematically showing an example of the energy band structure at the time when a hole does not exist during switching in the case where the HFET of FIG. 9 does not include a deep impurity level.
Figure 12B:
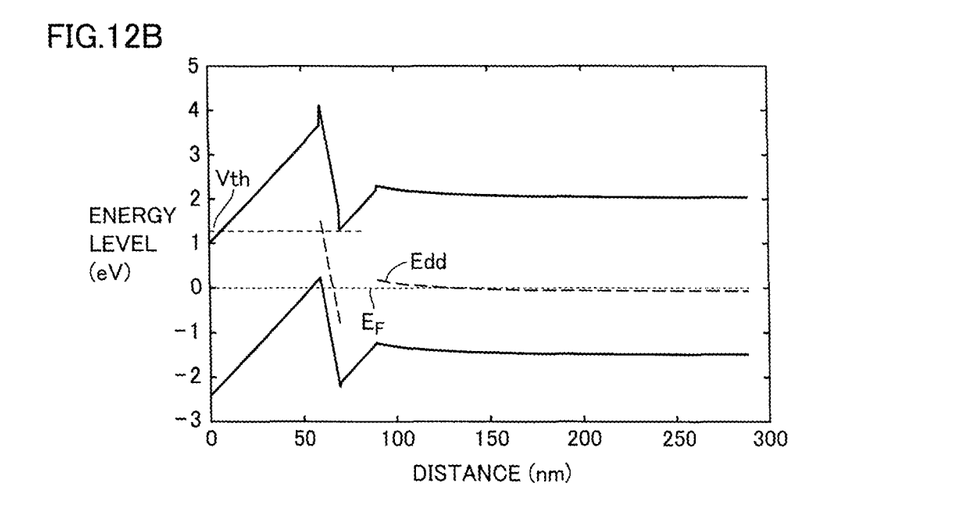
FIG. 12B is a graph schematically showing an example of the energy band structure at the time when a hole does not exist during switching in the case where the HFET of FIG. 9 includes a deep impurity level.

In the case where w=0.05, $t_1$=1000 nm, $t_{ch}$=20 nm, y=0.25, $t_3$=10 nm, z=0, and $t_4$=60 nm in the HFET of FIG. 9, FIG. 12A schematically shows the energy band structure at the time when a hole does not exist under the condition that a deep impurity level is not included, and FIG. 12B schematically shows the energy band structure at the time when a hole does not exist under the condition that a deep impurity level is included. In the case of FIG. 12B, an impurity concentration $N_{dd}$ is $10^{17}$ cm$^{-3}$ and a deep impurity levels $E_{dd}$ is located higher by 1.42 eV from an upper limit E, of the valence band.

In the HFET including a triple heterojunction, as shown in FIG. 12A, in the proximity of the triple heterojunction, Fermi level $E_F$ in $Al_{0.05}Ga_{0.95}N$ layer 11 exists near the upper limit of the valence band. However, when deep impurity level $E_{dd}$ exists in $Al_{0.05}Ga_{0.95}N$ layer 11, Fermi level $E_F$ is to be pinned in the proximity of deep impurity level $E_{dd}$, as shown in FIG. 12B. It is considered that a lower limit $E_C$ of the conduction band is consequently lowered, with the result that threshold voltage $V_{th}$ decreases in the HFET including a triple heterojunction.

Figure 13A:
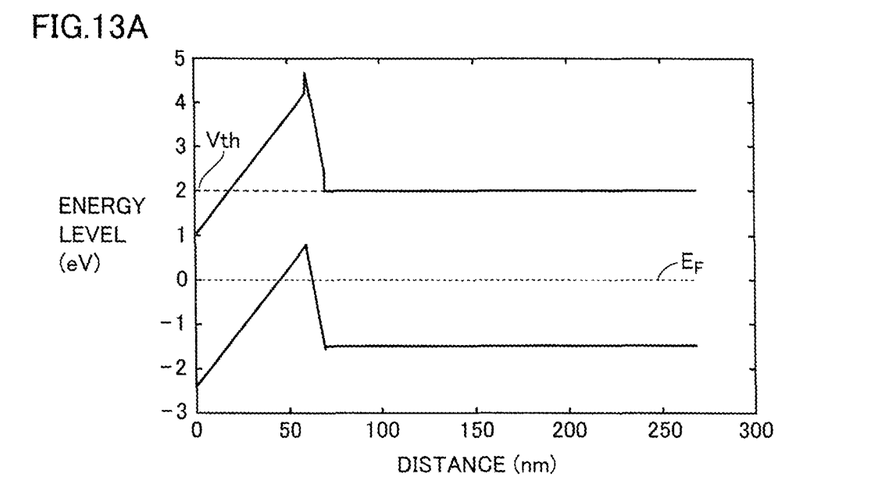
FIG. 13A is a graph schematically showing an example of the energy band structure at the time when a hole does not exist during switching in the case where the HFET of FIG. 1 does not include a deep impurity level.
Figure 13B:
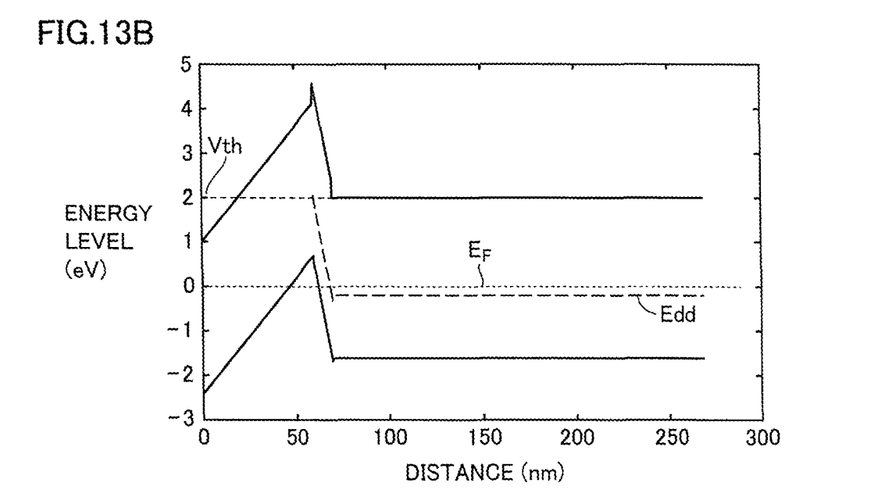
FIG. 13B is a graph schematically showing an example of the energy band structure at the time when a hole does not exist during switching in the case where the HFET of FIG. 1 includes a deep impurity level.

FIGS. 13A and 13B each schematically show an energy band structure related to the HFET including a double heterojunction, which is different as compared with FIGS. 12A and 12B only in that GaN channel layer 11a is not included. In the HFET including a double heterojunction, as shown in FIG. 13A, Fermi level $E_F$ in $Al_{0.05}Ga_{0.95}N$ layer 11 is located approximately in the center of the forbidden band especially in the proximity of its double heterojunction. In this case, even if deep impurity level $E_{dd}$ exists in $Al_{0.05}Ga_{0.95}N$ layer 11, Fermi level $E_F$ is less influenced by deep impurity level $E_{dd}$, as shown in FIG. 13B. Therefore, it is considered that lower limit $E_C$ of the conduction band is also less influenced, with the result that threshold voltage $V_{th}$ hardly decreases in the HFET including a double heterojunction even if a deep impurity level exists.

Second Embodiment

Figure 14:
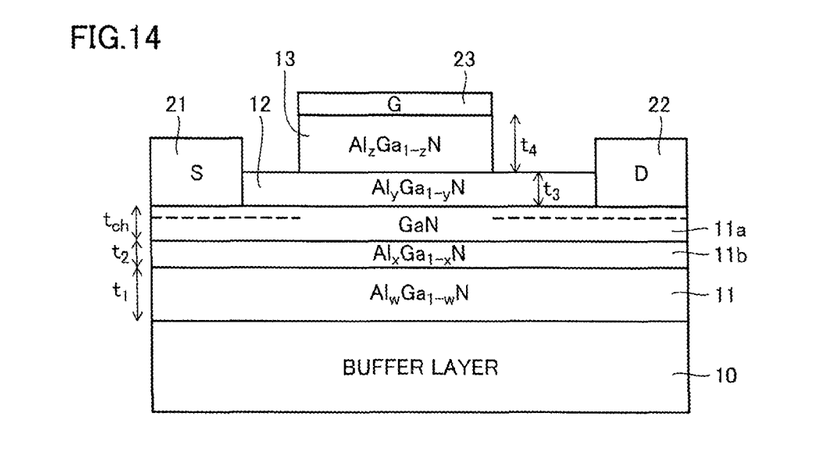
FIG. 14 is a schematic cross-sectional view of an HFET according to another embodiment of the present invention.

FIG. 14 is a schematic cross-sectional view of an HFET according to the second embodiment of the present invention. As compared with FIG. 9, this HFET in FIG. 14 is different as compared with FIG. 9 only in that $Al_xGa_{1-x}N$ layer 11b of $t_2$ thickness is inserted between $Al_wGa_{1-w}N$ layer 11 and GaN channel layer 11a. In other words, the HFET in FIG. 9 includes a triple heterojunction, whereas the HFET in FIG. 14 includes a quadruple heterojunction.

Also in the HFET of FIG. 14 including a quadruple heterojunction in this way, a capacitance model can be applied as in the case of the HFET in FIG. 9 including a triple heterojunction. In other words, sheet charge density $qn_s$ (C/cm$^2$) in the HFET of FIG. 14 can also be expressed by the following formula (1b) as in the above-described formula (1a).

$$qn_s = (\sigma_{3ch} + \sigma_{ch2} + \sigma_{21}) + \sigma_{43} \cdot t_4 \in_3 / (t_3 \in_4 + t_4 \in_3) + C \cdot (V_{gs} - V_b) \quad (1b)$$

Here, $\sigma_{21}$ denotes a positive fixed sheet charge density due to the polarity difference between $Al_wGa_{1-w}N$ layer 11 and $Al_xGa_{1-x}N$ layer 11b, and $\sigma_{ch2}$ denotes a negative fixed sheet charge density due to the polarity difference between $Al_xGa_{1-x}N$ layer 11b and GaN channel layer 11a.

Figure 15:
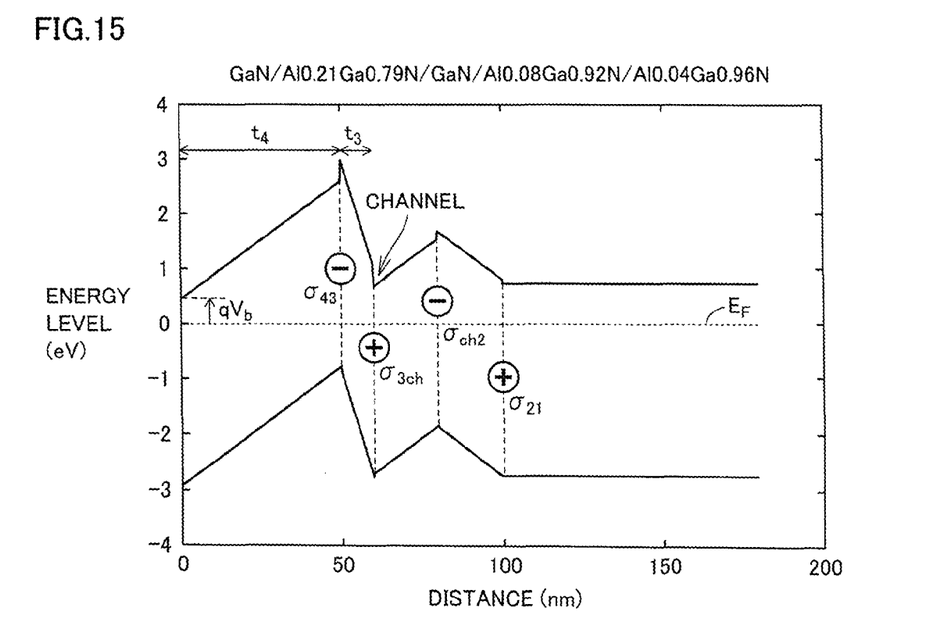
FIG. 15 is a graph schematically showing, in the energy band structure, fixed sheet charge density a caused due to the polarity difference between two adjacent layers in the heterojunction interface.

As a reference to formula (1b), FIG. 15 similar to FIG. 11 schematically shows fixed sheet charge densities $\sigma_{21}$, $\sigma_{ch2}$, $\sigma_{3ch}$, and $\sigma_{43}$ in the energy band structure. In this case, as compared with the triple heterojunction shown in FIG. 11, the quadruple heterojunction in FIG. 14 is different only in that $Al_{0.08}Ga_{0.92}N$ layer 11b of $t_2$ thickness=20 nm is included.

When comparing formula (1b) with formula (1), it turns out that these formulas are different only in that $\sigma_{31}$ in formula (1) is replaced with $(\sigma_{3ch}+\sigma_{ch2}+\sigma_{21})$ in formula (1b). Then, formula (1b) can also be changed as in the case of formula (1), and the following formula (4b) similar to formula (4) and formula (4a) can be obtained.

$$V_{th}=V_b-(t_3/\in_3+t_4/\in_4)\cdot\{(\sigma_{3ch}+\sigma_{ch2}+\sigma_{21})+\sigma_{43}\cdot t_4\in_3/(t_3\in_4+t_4\in_3)\} \quad (4b)$$

A curved line Q in the graph of FIG. 7 denotes the measured voltage-current characteristics in the HFET of FIG. 14. In other words, the HFET of FIG. 14 having the characteristics of curved line Q is different as compared with the HFET of FIG. 1 having the characteristics of curved line D not only in that GaN channel layer 11a of $t_{ch}$ thickness=20 nm is inserted between $Al_{0.05}Ga_{0.95}N$ layer 1.1 and $Al_{0.25}Ga_{0.75}N$ layer 12, but also in that $Al_{0.1}Ga_{0.9}N$ layer 11b is inserted between $Al_{0.05}Ga_{0.95}N$ layer 11 and GaN channel layer 11a. As described above, since the GaN layer has electron mobility higher than that of the AlGaN layer, the HFET of FIG. 9 may also be expected to have a relatively lower on-resistance.

In fact, as demonstrated in comparison between curved lines D and Q in FIG. 7, and in comparison between the graphs (A) and (C) in FIG. 8, it turns out that the HFET of FIG. 14 including GaN channel layer 11a shows a drain current $I_d$ higher at the same gate-drain electrode voltage $V_{gs}$ than that of the HFET in FIG. 1, that is, has a relatively lower on-resistance. Furthermore, in comparison between curved lines T and Q in FIG. 7, and in comparison between the graphs (B) and (C) in FIG. 8, it also turns out that although the HFET of FIG. 14 has an on-resistance slightly higher than that of the HFET of FIG. 9, the HFET of FIG. 9 achieves only a low threshold voltage of about 1V while the HFET of FIG. 14 has a relatively higher threshold voltage of about 2V. The present inventor construed the reason thereof as described below.

Figure 16A:
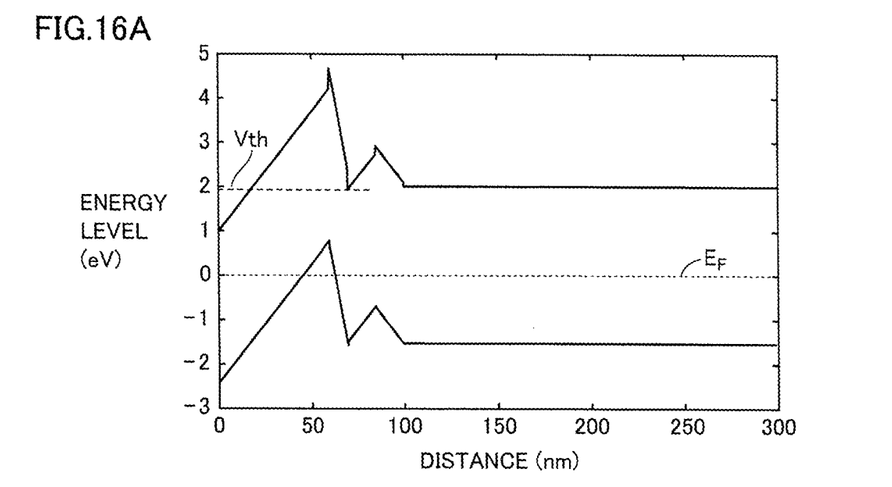
FIG. 16A is a graph schematically showing an example of the energy band structure at the time when a hole does not exist during switching in the case where the HFET of FIG. 14 does not include a deep impurity level.
Figure 16B:
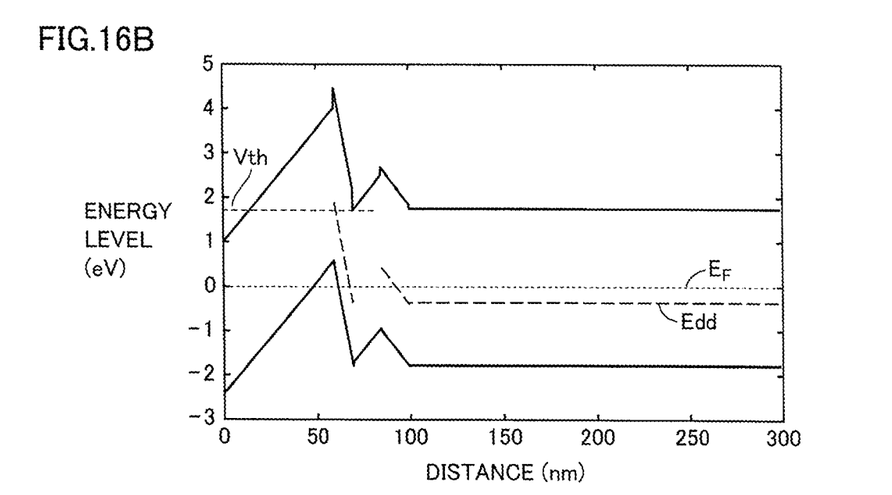
FIG. 16B is a graph schematically showing an example of the energy band structure at the time when a hole does not exist during switching in the case where the HFET of FIG. 14 includes a deep impurity level.

FIGS. 16A and 16B each schematically show the energy band structure related to the HFET including a quadruple heterojunction, which is different as compared with FIGS. 12A and 12B only in that $Al_{0.1}Ga_{0.9}N$ layer 11b is additionally included. Similarly to FIG. 13A regarding the HFET including a double heterojunction, also in the HFET including a quadruple heterojunction, Fermi level $E_F$ in $Al_{0.05}Ga_{0.95}N$ layer 11 is located approximately in the center of the forbidden band in the proximity of its quadruple heterojunction, as shown in FIG. 16A. In this case, even if deep impurity level $E_{dd}$ exists in $Al_{0.05}Ga_{0.95}N$ layer 11, as shown in FIG. 16B, Fermi level $E_F$ is less influenced by deep impurity level $E_{dd}$, and thus, lower limit $E_C$ of the conduction band is also less influenced. As a result, it is considered that threshold voltage $V_{th}$ is not so much decreased even if a deep impurity level exists also in the HFET including a quadruple heterojunction, similarly to the case of the HFET including a double heterojunction.

In the following, the preferable range of $t_2$ thickness of $Al_xGa_{1-x}N$ layer 11b in the HFET of FIG. 14 will be described. First, it is desirable that $t_2$ thickness is greater than 1 nm. This is because if $t_2$ is 1 nm or less, the effect of inserting $Al_xGa_{1-x}N$ layer 11b is to be substantially lost, and the HFET of FIG. 14 including a quadruple heterojunction substantially becomes similar to the HFET of FIG. 9 including a triple heterojunction.

On the other hand, the energy band structure near the heterojunction by $Al_xGa_{1-w}N$ layer 11, $Al_xGa_{1-x}N$ layer 11b and GaN channel layer 11a is influenced by w, x, $t_2$, and $t_{ch}$.

Figure 17A:
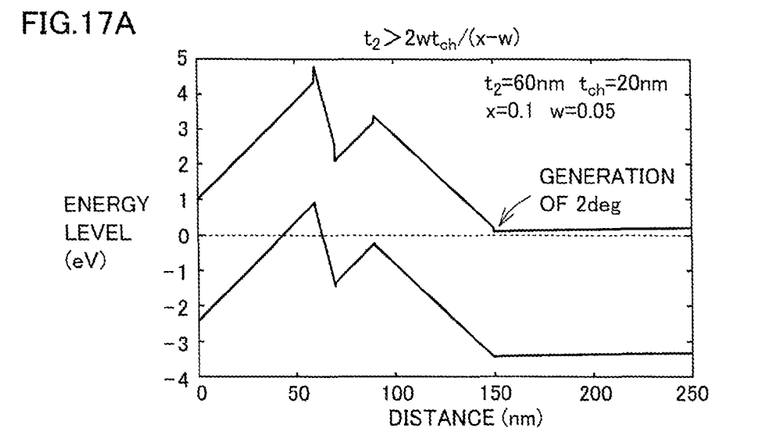
FIG. 17A is a graph schematically showing an example of the energy band structure at the time when a hole does not exist during switching in the case where the HFET of FIG. 14 includes an layer 11b of a large $t_2$ thickness.

FIG. 17A shows the energy band structure of the HFET in FIG. 14 at the time when a hole does not exist in the case where $t_2$ is a relatively large value of 60 nm, $t_{ch}$=20 nm, x=0.1 and w=0.05. In this case, as shown in FIG. 17A, two-dimensional electron gas (2 deg) is generated in the heterointerface between $Al_wGa_{1-w}N$ layer 11 and $Al_xGa_{1-x}N$ layer 11b, so that threshold voltage $V_{th}$ of the HFET in FIG. 14 decreases.

Figure 17B:
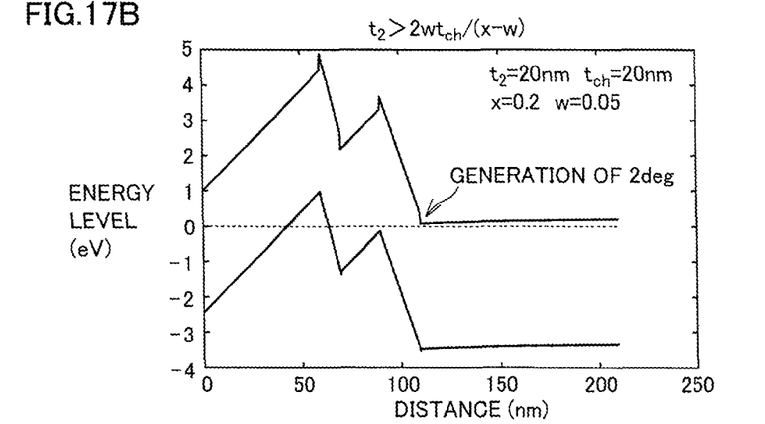
FIG. 17B is a graph schematically showing an example of the energy band structure at the time when a hole does not exist during switching in the case where the value of "x" in $Al_xGa_{1-x}N$ layer 11b in the HFET of FIG. 14 is relatively large.

FIG. 17B shows the energy band structure of the HFET in FIG. 14 at the time when a hole does not exist in the case where x is a relatively large value of 0.2, $t_2$=20 nm, $t_{ch}$=20 nm, and w=0.05. Also in this case, as shown in FIG. 17B, two-dimensional electron gas (2 deg) is generated in the heterointerface between $Al_wGa_{1-w}N$ layer 11 and $Al_xGa_{1-x}N$ layer 11b, so that threshold voltage $V_{th}$ of the HFET in FIG. 14 decreases.

In each case of FIGS. 17A and 17B described above, the relation of $t_2>2wt_{ch}/(x-w)$ is satisfied. Therefore, in order to avoid a decrease in threshold voltage $V_{th}$ of the HFET in FIG. 14, it is desirable to satisfy the condition of $t_2<2wt_{ch}/(x-w)$.

Figure 17C:
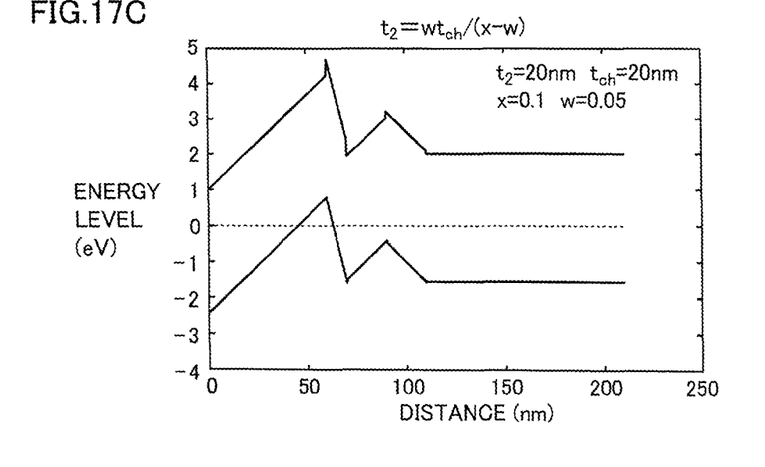
FIG. 17C is a graph schematically showing an example of the energy band structure at the time when a hole does not exist during switching in the case where $Al_xGa_{1-x}N$ layer 11b in the HFET of FIG. 14 has a desirable $t_2$ thickness.

FIG. 17C shows the energy band structure of the HFET in FIG. 14 at the time when a hole does not exist in the case of $t_2=wt_{ch}/(x-w)$ satisfying the condition of $t_2<2wt_{ch}/(x-w)$. In this case, as shown in FIG. 17C, two-dimensional electron gas (2 deg) is not generated in the heterointerface between $Al_wGa_{1-w}N$ layer 11 and $Al_xGa_{1-x}N$ layer 11b, so that it becomes possible to avoid a decrease in threshold voltage $V_{th}$ of the HFET in FIG. 14.

In addition, although the HFET including undoped GaN channel layer 11a has been explained in the above-described embodiments, for example. In having a composition ratio of 0.03 may be added in a relatively smaller composition ratio equal to or less than 0.05 to Ga, for the purpose of increasing the electron mobility in channel layer 11a. Furthermore, in undoped $Al_xGa_{1-x}N$ layer 11b included in the HFET, starting from its lower surface side toward the upper surface side, the value of "x" may be gradually increased in the range from 0.05 to 0.15. Furthermore, mesa-type $Al_xGa_{1-x}N$ layer 13 included in the HFET can also be replaced with a p-type GaN layer or an InAlGaN layer, if desirable.

INDUSTRIAL APPLICABILITY

As described above, according to the present invention, it is possible to provide a normally-off-type HFET having a relatively higher threshold voltage and a relatively lower on-resistance with an easier process and at a lower cost.

REFERENCE SIGNS LIST

10: buffer layer; 11: undoped $Al_wGa_{1-x}N$ layer; 11a: undoped GaN layer; 11b: undoped $Al_xGa_{1-x}N$ layer, 12: undoped $Al_yGa_{1-y}N$ layer; 13: undoped $Al_zGa_{1-z}N$ layer; 21: source electrode; 22 drain electrode; 23: Schottky barrier type gate electrode.

The invention claimed is:
1. A normally-off-type HFET comprising:
   an undoped $Al_wGa_{1-w}N$ layer of t1 thickness, an undoped $Al_xGa_{1-x}N$ layer of $t_2$ thickness and an undoped GaN channel layer of $t_{ch}$ thickness that are sequentially stacked;
   a source electrode and a drain electrode separated from each other and electrically connected to said channel layer;

an undoped $Al_yGa_{1-y}N$ layer of $t_3$ thickness formed between said source electrode and said drain electrode on said channel layer;

an $Al_zGa_{1-z}N$ layer of $t_4$ thickness formed in a shape of a mesa on a partial area of said $Al_yGa_{1-y}N$ layer between said source electrode and said drain electrode; and a Schottky barrier type gate electrode formed on said $Al_zGa_{1-z}N$ layer, conditions of $y>x>w>z$, $t_1>t_4>t_3$ and $2wt_{ch}/(x-w)>t_2>1$ nm being satisfied.

2. The normally-off-type HFET according to claim 1, wherein a condition of $w-z>0.03$ is satisfied.

3. The normally-off-type HFET according to claim 1, wherein a condition of $t_4/t_3>4$ is satisfied.

4. The normally-off-type HFET according to claim 1, wherein said $Al_zGa_{1-z}N$ layer is undoped.

5. The normally-off-type HFET according to claim 1, wherein the gate electrode comprises an Ni/Au stacked layer, a WN layer, a TiN layer, a W layer, or a Ti layer.

6. The normally-off-type HFET according to claim 1, wherein said $Al_wGa_{1-w}N$ layer, said $Al_xGa_{1-x}N$ layer, said GaN channel layer, said $Al_yGa_{1-y}N$ layer, and said $Al_zGa_{1-z}N$ layer each have a Ga polarity in which a Ga atomic plane appears on a (0001) plane of an upper surface side.

7. A normally-off-type HFET comprising:

an undoped $Al_wGa_{1-w}N$ layer of $t_1$ thickness and an undoped GaN channel layer of $t_{ch}$ thickness that are sequentially stacked;

a source electrode and a drain electrode separated from each other and electrically connected to said channel layer;

an undoped $Al_yGa_{1-y}N$ layer of $t_3$ thickness formed between said source electrode and said drain electrode on said channel layer;

an $Al_zGa_{1-z}N$ layer of $t_4$ thickness formed in a shape of a mesa on a partial area of said $Al_yGa_{1-y}N$ layer between said source electrode and said drain electrode; and a Schottky barrier type gate electrode formed on said $Al_zGa_{1-z}N$ layer, conditions of $y>w>z$ and $t_1>t_4>t_3$ being satisfied.

* * * * *